United States Patent
Shojaei et al.

(10) Patent No.: US 11,651,931 B2
(45) Date of Patent: May 16, 2023

(54) REFILLABLE ION CHAMBER WITH AUTOMATED PURGING SYSTEM

(71) Applicant: Varian Medical Systems, Inc., Palo Alto, CA (US)

(72) Inventors: Amir Shojaei, Aliso Viejo, CA (US); Philip Adamson, Palo Alto, CA (US); Flavio Poehlmann-Martins, Fremont, CA (US)

(73) Assignee: VARIAN MEDICAL SYSTEMS, INC., Palo Alto, CA (US)

( * ) Notice: Subject to any disclaimer, the term of this patent is extended or adjusted under 35 U.S.C. 154(b) by 134 days.

(21) Appl. No.: 17/195,509

(22) Filed: Mar. 8, 2021

(65) Prior Publication Data

US 2022/0285122 A1 Sep. 8, 2022

(51) Int. Cl.
*H01J 37/08* (2006.01)
*H01J 37/16* (2006.01)

(52) U.S. Cl.
CPC .............. *H01J 37/08* (2013.01); *H01J 37/16* (2013.01); *H01J 2237/022* (2013.01); *H01J 2237/166* (2013.01); *H01J 2237/186* (2013.01); *H01J 2237/1825* (2013.01)

(58) Field of Classification Search
CPC ...... H01J 37/08; H01J 37/16; H01J 2237/022; H01J 2237/166; H01J 2237/186; H01J 2237/1825
See application file for complete search history.

(56) References Cited

U.S. PATENT DOCUMENTS

| 6,341,006 | B1* | 1/2002 | Murayama | ........... G03F 7/70883 250/492.1 |
| 6,571,057 | B2* | 5/2003 | Aoki | ................... G03F 7/70883 430/311 |
| 2012/0111374 | A1* | 5/2012 | Despres | .................. H01J 37/02 134/198 |
| 2018/0180750 | A1* | 6/2018 | McGregor | .............. G01T 3/008 |

* cited by examiner

*Primary Examiner* — David E Smith
*Assistant Examiner* — Hsien C Tsai
(74) *Attorney, Agent, or Firm* — Harness, Dickey & Pierce, P.L.C.

(57) ABSTRACT

An apparatus includes an ion chamber and a valve assembly. The ion chamber may include a housing enclosing a gas and one or more electrodes. The valve assembly is coupled to the ion chamber allowing control of replacement of the gas within the housing.

20 Claims, 7 Drawing Sheets

REFILLABLE ION CHAMBER WITH AUTOMATED PURGING SYSTEM

TECHNICAL FIELD

This disclosure relates generally to radiation apparatuses and methods. In particular, various embodiments of refillable ion chambers and automated purging systems are described.

BACKGROUND

The performance of sealed ion chambers (ICs) used in radiation machines are known to deteriorate with aging. One early characteristic of deterioration is signal transients when the radiation beam is turned on. During routine operation, signal transients may worsen to a point where interlocks are triggered for flatness or symmetry faults, leading to false positive errors. Eventually the false positive rate is sufficiently high to warrant replacement of an ion chamber. Furthermore, when a radiation machine operates in a flash mode where the entire treatment is delivered in only a few pulses, tolerance for beam-on transients is much lower because the entire treatment would be delivered before the signal has even stabilized. Therefore, for a radiation machine operating in a flash mode, the replacement rate of ion chambers would be much higher, leading to greater cost and more impact on the machine uptime.

Replacing failed ion chambers in the field is very time-consuming and can result in prolonged machine downtime associated with retuning and recommissioning upon installation of new ion chambers. During the installation of a new ion chamber, its position may be shifted and consequently the machine may need to be re-tuned. Especially, when the radiation machine operates in a flash mode, the specifications for maximal tolerable beam-on transients would be much more stringent and ion chambers would have to be replaced much more frequently.

Therefore, there is a general need for prolonging the performance of ion chambers. It would be desirable to provide a refillable ion chamber whose performance can be restored by refurbishment. It would be desirable to provide a method for refurbishing an ion chamber installed on a radiation machine to eliminate or reduce the need for retuning and recommissioning the machine to save time and cost.

SUMMARY

An embodiment of the disclosure provides an apparatus comprising an ion chamber and a valve assembly. The ion chamber comprises a housing enclosing a gas that may be ionizable by radiation and one or more electrodes capable of creating an electrical field. The valve assembly is coupled to the ion chamber allowing control of replacement of the gas within the housing.

An embodiment of the disclosure provides a method of refurbishing an ion chamber. The method comprises removing contamination from the gas enclosed in the housing of the ion chamber and refilling the housing with a gas from a gas source. The contamination can be removed by purging the housing using a pristine gas. Alternatively, an evacuation pump can be used to remove the contamination from the gas enclosed in the housing.

This Summary is provided to introduce selected aspects and embodiments of this disclosure in a simplified form and is not intended to identify key features or essential characteristics of the claimed subject matter, nor is it intended to be used as an aid in determining the scope of the claimed subject matter. The selected aspects and embodiments are presented merely to provide the reader with a brief summary of certain forms the invention might take and are not intended to limit the scope of the invention. Other aspects and embodiments of the disclosure are described in the section of Detailed Description.

BRIEF DESCRIPTION OF THE DRAWINGS

These and various other features and advantages will become better understood upon reading of the following detailed description in conjunction with the accompanying drawings provided below, where.

DETAILED DESCRIPTION OF EMBODIMENTS

With reference to FIGS. 1-6, various embodiments of a refillable ion chamber, a purging and refilling system, and a method of refurbishing ion chambers will be described. It should be noted that the figures are intended for illustration of embodiments but not as an exhaustive description or a limitation on the scope of the disclosure. Structures and method steps alterative to those shown and described herein will be readily recognized as being viable without departing from the principle of the claimed invention.

In general, the disclosure provides solutions for restoring or prolonging the performance of ion chambers and reducing the downtime of radiation machines associated with retuning and recommissioning of the machines upon installation of new ion chambers. One solution is to provide a refillable ion chamber which allows for recharge in the field, thereby eliminating or reducing the need for retuning and recommissioning of the machine upon installation of a new ion chamber. For example, one embodiment of the disclosure provides an ion chamber integrated with a valve assembly, allowing for purging and refilling of the ion chamber with a new pristine gas. Another embodiment of the disclosure provides an automated purging and refilling system that allows for refurbishing an ion chamber. The refillable ion chamber and the purging and refilling system of the disclosure allow for continuous or scheduled refurbishment of the ion chamber, thereby effectively prolonging or restoring the performance of the ion chamber. This considerably reduces the costs and downtime of the radiation machine associated with replacement of ion chambers.

Figure 1:
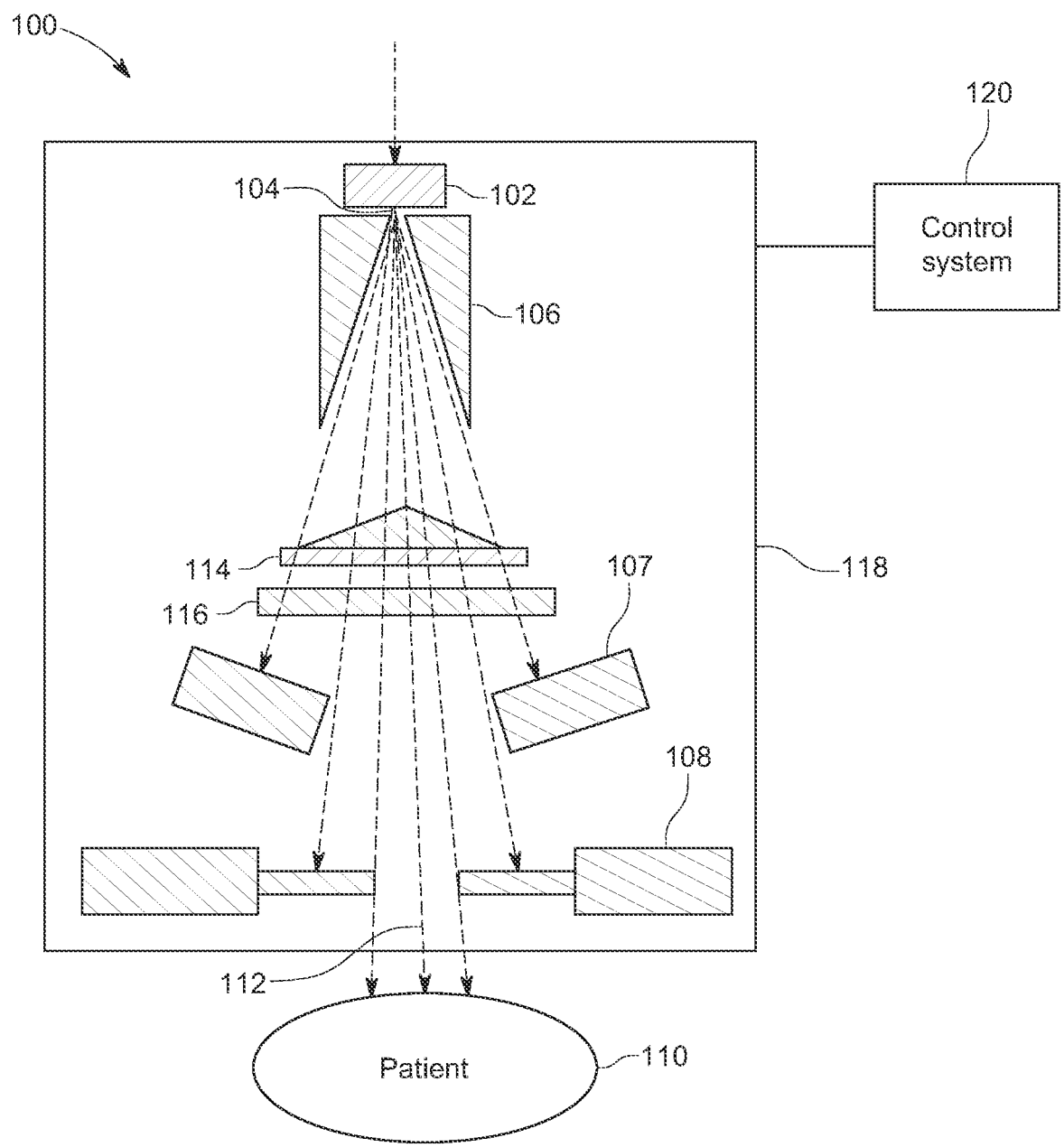
FIG. 1 is a simplified illustration of a radiation apparatus including an example ion chamber (IC) according to embodiments of the disclosure.

With reference to FIG. 1, an ion chamber or apparatus according to embodiments of the disclosure is now described in conjunction with a radiation system or apparatus. It should be noted that while various embodiments are described in conjunction with a radiation apparatus for medical treatment, the scope of the disclosure or of the claims is not so limited. The refillable ion chamber and the principle of the disclosure can be employed in other applications or industries such as environmental monitoring, research laboratory, and so on.

With reference to FIG. 1, a radiation apparatus 100 may include a radiation source 102 producing or emitting a beam 104 of radiation such as photons, electrons, protons, or other types of radiation. By way of example, the radiation source 102 may include a metallic target configured to produce a beam of photons or x-rays upon impingement of electrons. The radiation apparatus 100 also includes various collimating devices or components configured to limit, define, or modify the size, shape, fluence, and other characteristics of the beam. For example, a primary collimator 106 adjacent to the source 102 and optionally a secondary collimator 107 may generally limit the extent of the divergent beam 104 as it travels away from the source 102. A multileaf collimator (MLC) 108 may be disposed between the source 102 and a patient 110 to shape the beam. The MLC 108 may be rotated about the beam's central axis 112, an axis passing through the source 102 and perpendicular to an isocenter plane, placing the MLC 108 in various orientations. The radiation apparatus 100 may optionally include a flattening filter 114 to modify the beam profile. Alternatively, the radiation apparatus does not include any flattening filter or is flattening-filter-free (FFF) to enhance dose rates for treatment. An ion chamber 116 can be disposed in the beam path to monitor one or more characteristics of the beam 104 from the source 102. The source 102, primary collimator 106, secondary collimators 107, MLC 108, ion chamber 116, and other devices or components may be enclosed in a gantry 118, such as a ring gantry or a C-arm gantry, which can be rotated about an axis such as a horizontal axis, or in an enclosure movable by a robotic arm. Therefore, the apparatus 100 can deliver radiation to a target in the patient 110 from various angles, and one or more characteristics of the radiation beam 104 can be monitored as the beam angle is stepped or swept around the target. The operation of the source 102, ion chamber 116, and other devices of the radiation apparatus 100 can be controlled by a control system 120.

With reference to FIG. 1, the ion chamber 116 can be configured to measure the dose distribution profile of the beam 114, such as the homogeneity of the beam across the treatment filed, the symmetry of the beam about the beam's central axis, the alignment and/or directionality of the beam, and so on. As will be described in greater detail below, the ion chamber 116 may include a housing providing an enclosed volume for a gas and spaced electrodes. The gas may be ionizable by radiation to produce ion pairs. The spaced electrodes are capable of creating an electric field allowing the ion pairs to migrate under the influence of the field. Signals derived from the ion pairs, which are directly proportional to the radiation intensity, can be measured and/or analyzed by electrical circuitries and used in controlling the operation of the apparatus 100.

The performance of ion chambers may deteriorate with aging. The deterioration rate may depend on factors such as the number of patients treated per day, energy modes used, and the age of the ion chambers. One root cause of failure of sealed ion chambers such as emergence of beam-on-transients is the oxygen depletion and contamination of the gas in the ion chamber attributable to radiation-induced chemical processes. The inventors discovered that by removing the contaminated gas from the ion chamber, and replenishing oxygen with a new pristine gas, the performance of the ion chamber can be restored to a level same as or similar to that of a new ion chamber.

Figure 2A:
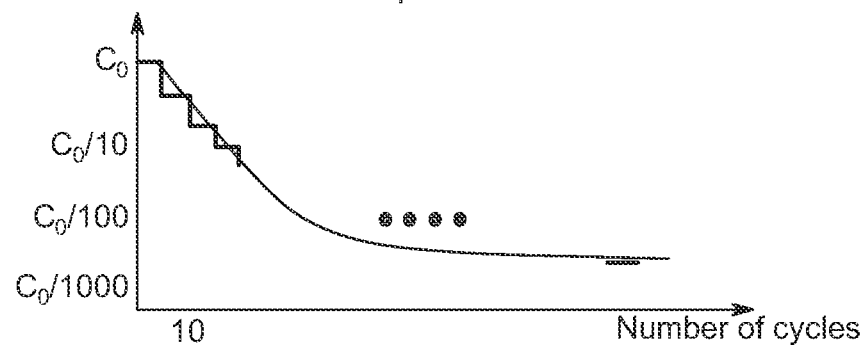
FIG. 2A is a graph illustrating the change of concentration of contaminants in a sealed ion chamber with the number of purging cycles according to embodiments of the disclosure.
Figure 2B:
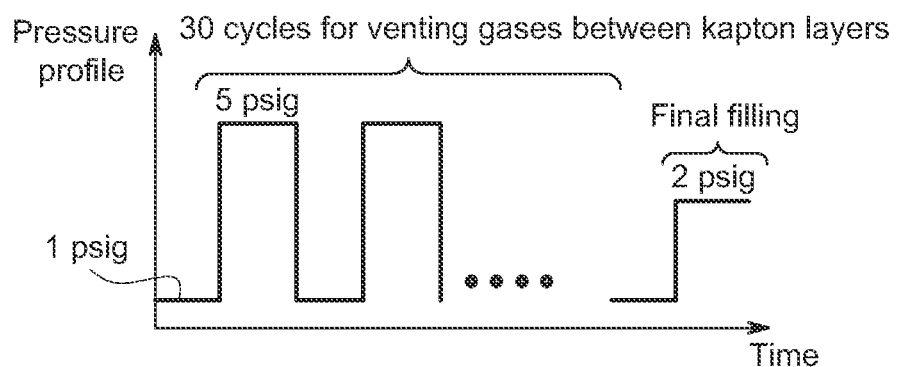
FIG. 2B is a graph illustrating an example pressure profile used in a purging process according to embodiments of the disclosure.

With reference to FIGS. 2A-2B, the inventors discovered that the level of contamination of the gas in a sealed ion chamber can be reduced to an acceptable level via repeated purging of the ion chamber. FIG. 2A is a graph illustrating the change of concentration of contaminants in a sealed ion chamber with the number of purging cycles. By way of example, starting from an initial contaminant concentration level, i.e., $C_0$, the concentration of contaminants will drop to a level, e.g., one tenth ($C_0/10$), one hundredth ($C_0/100$), and one thousandth ($C_0/1000$) of the initial concentration level as the number of purging cycles increases. This cyclical sequence makes it unnecessary to use an evacuation pump, avoiding structural damage from under-pressurizing the ion chamber. Alternatively, an evacuation pump can be used in the purging cycles. FIG. 2B is a graph illustrating an example pressure profile which can be used in the purging cycles. By way of example, during a purging process, an ion chamber can be slightly over-pressurized with a new pristine gas e.g., at 5 psig, and then vented at a pressure of 1 psig. The cycle can be repeated several times with the pressure profile, and every cycle reduces the concentration of contaminants remaining within the ion chamber. Once the contaminant concentration is reduced to an acceptable level, a final filling can occur at a pressure e.g., 2 psig.

Accordingly, embodiments of the disclosure provide a refillable ion chamber. One embodiment provides an apparatus comprising an ion chamber and a valve assembly integrated with or coupled to the ion chamber. The ion chamber may include a housing enclosing a gas ionizable by radiation and spaced electrodes capable of creating an electrical field. The valve assembly allows for control of replacement of the gas within the housing with a pristine gas from a gas source.

Figure 3A:
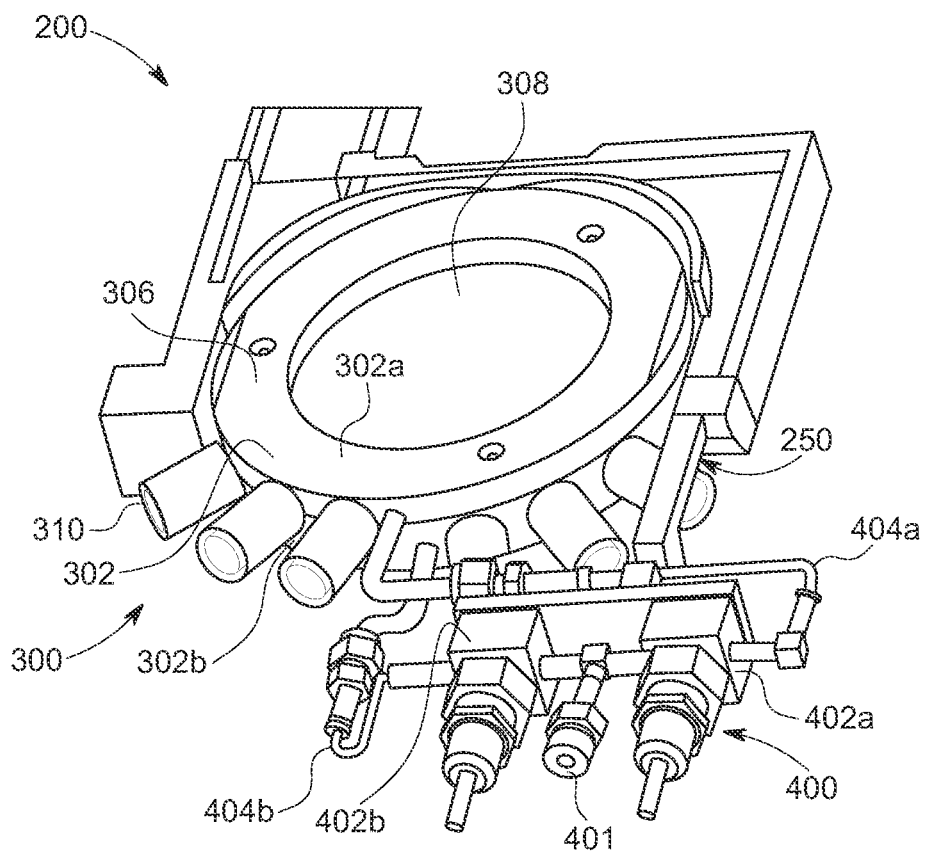
FIG. 3A is an isometric view of an example ion chamber integrated with a valve assembly according to embodiments of the disclosure.
Figure 3B:
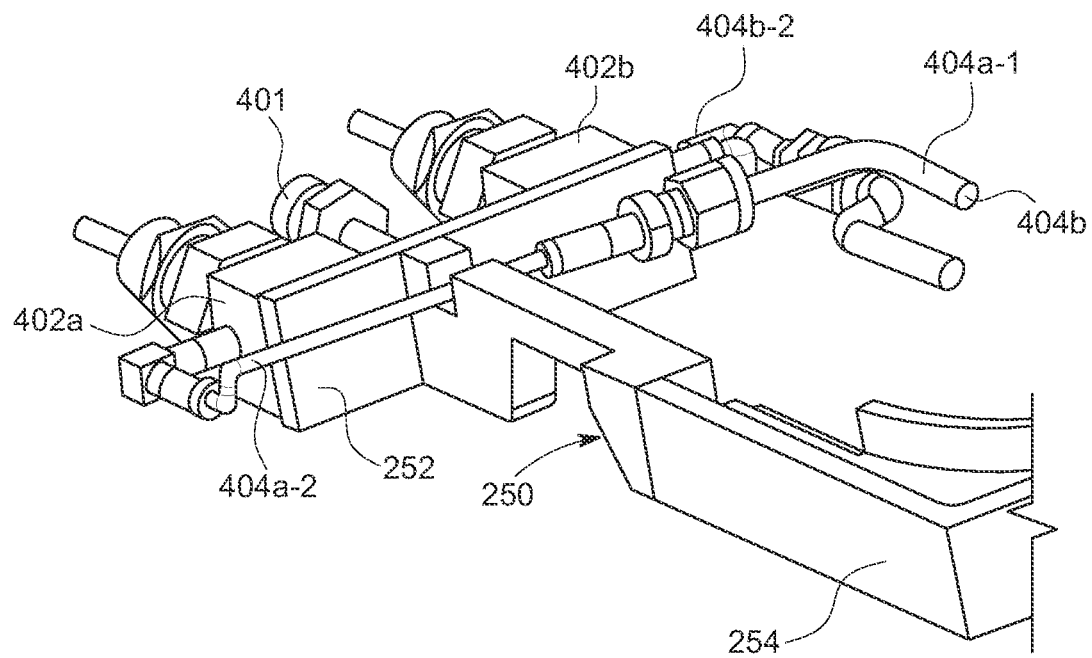
FIG. 3B depicts an example supporting structure for the valve assembly shown in FIG. 3A.

With reference to FIGS. 3A-3B, an example apparatus 200 includes an ion chamber 300 and a valve assembly 400 integrated with or coupled to the ion chamber 300. The apparatus 200 may also include a structure 250 supporting the valve assembly 400, allowing the valve assembly 400 to be mechanically isolated from the ion chamber 300, or allowing the weight of the valve assembly 400 to be substantially isolated from the weight of the ion chamber 300. The supporting structure 250 may be secured to the gantry 118 of the radiation machine 100 (see FIG. 1) by any suitable means.

Figure 4A:
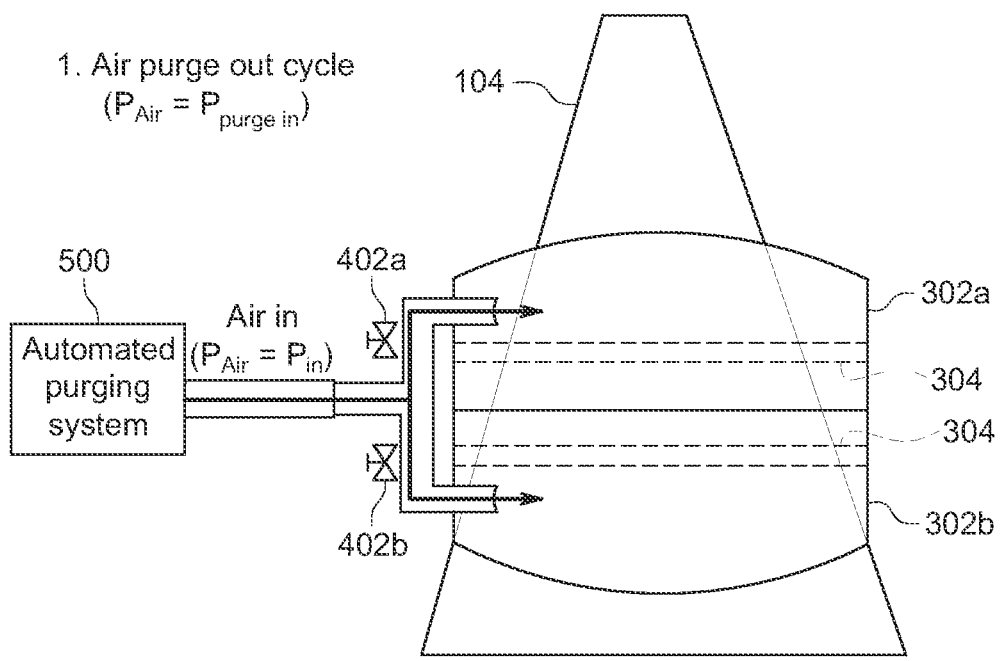
FIG. 4A schematically shows a gas purge-in cycle according to embodiments of the disclosure.
Figure 4B:
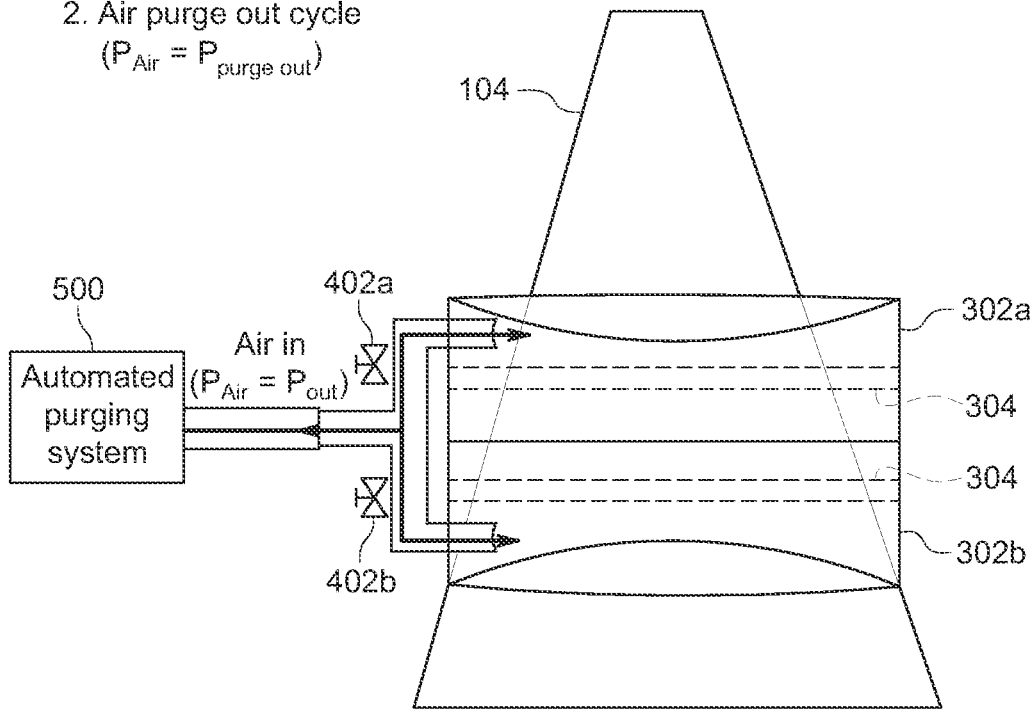
FIG. 4B schematically shows a gas purge-out cycle according to embodiments of the disclosure.
Figure 4C:
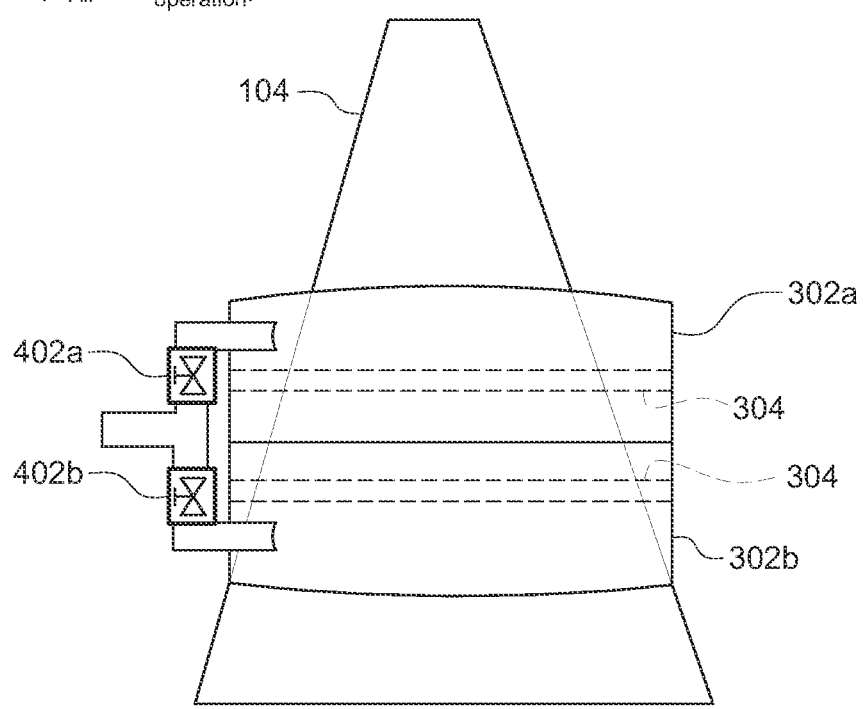
FIG. 4C schematically shows a sealed ion chamber refurbished according to embodiments of the disclosure.

With reference to FIGS. 3A-3B, the ion chamber 300 includes a housing 302 providing an enclosed volume for spaced electrodes 304 (see electrodes 304 in FIGS. 4A-4C). The housing 302 may be hermetically sealed to enclose a gas such as air or other suitable gas which can be ionized by radiation. Alternatively, the housing 302 is non-hermetically sealed. By way of example, the housing 302 may include two or more metal members such as ring members 306 which may be engaged with each other to form the housing. The abutting surface of the ring members 306 may be sealed by any suitable means to provide an air tight seal between the ring members. Windows 308 may be secured across the openings of the upper and lower ring members 306, forming an upper window and lower window allowing a radiation beam to enter and exit the ion chamber. The windows 308 also protect the electrodes 304 and other structures within the housing 302. Terminals 310 electrically connect the electrodes 304 within the housing 302, providing working voltage to the electrodes 304 and outputting signals to an electrical circuitry (not shown) for measurement and/or further analysis. The electrodes 304 (see also FIGS. 4A-4C) within the housing 302 in general comprises a high voltage electrode and a measurement or collection electrode spaced apart from each other. The collection electrode may include a pattern of a conductive material formed or deposited on an insulative film or plate. Therefore, the collection electrode may comprise a combination of electrodes patterned, segmented, or arranged for measuring different combinations of radiation passing across the ion chamber 300, thereby providing information about the profile of the radiation such as the intensity, the homogeneity of the beam across the treatment filed, the symmetry of the beam about the beam's central axis, and the alignment and/or directionality of the beam, etc.

With reference to FIGS. 3A-3B, in some embodiments, the housing 302 of the ion chamber 300 may include two or more individual housings or chambers 302a, 302b (see also FIGS. 4A-4C). The two or more individual chambers 302a, 302b may be constructed as a single monitoring unit as shown. The two or more individual chambers 302a, 302b may be isolated from or independent of each other. Each of the two or more individual chambers 302a, 302b may enclose a gas medium and spaced electrodes as described above. Two or more individual chambers can provide redundancy as may be required for medical treatment or serve to monitor different characteristics of a beam or different beams e.g., one for electrons and another for photons, and so on. Correspondingly, the valve assembly 400, to be described in greater detail below, may include two or more valves each being integrated with or coupled to one of the two or more individual chambers. For example, as shown in FIGS. 3A-3B, the top chamber 302a may be integrated with or coupled to a first valve 402a, and the bottom chamber 302b integrated with or coupled to a second valve 402b of the valve assembly 400.

It should be noted that the ion chamber 300 shown in FIGS. 3A-3B and described above is for illustration purpose by way of example. Ion chambers of various designs, including housings, electrode patterns, arrangements, and circuitries for measuring ions are known in the art, and the principle of the disclosure applies to any types of ion chambers.

With reference to FIGS. 3A-3B, the valve assembly 400 is coupled to or integrated with the ion chamber 300 allowing for replacement of the gas within the ion chamber 300 with a gas from a gas source. As shown, the valve assembly 400 may include one or more air ports 401 for connecting with a purging and refilling system, to be described in greater detail below, and one or more valves 402a, 402b operable to open allowing a gas to flow into and out of the ion chamber 300, and close allowing the ion chamber 300 to be sealed. The valves 402a, 402b can be any suitable types known in the art such as global valves, gate valves, ball valves, etc. Preferably, while not required, the operation of the valves 402a, 402b, including the opening and closing of the valves, can be automatically controlled to avoid or reduce the risks associated with human errors. For example, the valves 402a, 402b may be designed to be opened and/or closed at predetermined torque values to allow for automation. Alternatively, the valves 402a, 402b can be manually operated. Preferably, the valves 402a, 402b are selected to meet the leak rate requirements for sealed ion chambers. By way of example, the valves 402a, 402b can be selected to have a leak rate less than e.g., 1 e-9 cc/second. According to embodiments of the disclosure, the valves 402a, 402b are constructed from a radiation resistant material such as a metal to withstand damages under high-level radiation. As used herein, a radiation resistant material refers to a material which can withstand damages caused by radiation. Example valves suitable for the apparatus 200 include but are not limited to bellow-sealed valves available from e.g., Swagelok Company in Solon, Ohio.

With reference to FIGS. 3A-3B, the valve assembly 400 may be supported by a structure 250 such as a beam, plate, bracket, frame, or other supporting structure. The supporting structure 250 may serve to mechanically isolate the valve assembly 400 from the body of the ion chamber 300, or substantially isolate the weight of the valve assembly 400 from the weight of the ion chamber 300. As shown, the valves 402a, 402b may be secured to a plate 252, which can be attached to the supporting structure 250 via any suitable means such as bolts, nuts, or the like. This would prevent or reduce load transfer from the valve assembly 400 to the ion chamber 300, which otherwise could affect the position of the ion chamber 300. As such, the operation of the valve assembly 400, such as connecting with and/or disconnecting from a purging and refilling system, opening and/or closing the valves, etc., would not change the alignment of the ion chamber 300, thus eliminating or reducing the need for retuning of the radiation machine. The supporting structure 250 may be secured to the ion chamber bracket 254 or gantry 118 of the radiation machine 100 (see FIG. 1) by any suitable means. Optionally, the ion chamber 300 is also supported by the structure 250.

With reference to FIGS. 3A-3B, the valve assembly 400 may be coupled to the ion chamber 300 via tubing 404. By way of example, as shown, a first valve 402a can be coupled to the top chamber 302a via a tube 404a, and a second valve 402b coupled to the bottom chamber 302b via a tube 404b. The tube 404a may include a first portion 404a-1 integrated with the top chamber 302a e.g., by welding, and a second portion 404a-2 coupled to the first valve 402a. The first portion 404a-1 and the second portion 404a-2 may be connected via any suitable fittings such as vacuum coupling radiation (VCR) fittings which may provide leak-tight connection. Likewise, the tube 404b may include a first portion 404b-1 integrated with the bottom chamber 302b e.g., by welding, and a second portion 404b-2 coupled to the second valve 402b. The first portion 404b-1 and the second portion 404b-2 may be connected via any suitable fittings such as VCR fittings. The second portions 404a-2, 404b-2 of the tubes 404a, 404b may be flexible and supported by the supporting structure 250 to help avoid or reduce load transfer from the valve assembly 400 to the ion chamber 300, and thus minimizing the impact of the valve assembly 400 on the location or alignment of the ion chamber 300. The tubes 404a, 404b, including the first portions and the second portions, can be made of a radiation resistant material such as a metal.

With reference now to FIGS. 4A-4C, the valve assembly 400 shown in FIGS. 3A-3B allows the ion chamber 300 to be recharged or refurbished. As shown, when a recharge or refurbishment is desired, the valve assembly 400 can be connected with a purging and refilling system 500 to be described in greater detail below. In a purge-in cycle shown in FIG. 4A, the first valve 402a can be opened to allow a gas from a gas source to flow into the top ion chamber 302a. The second valve 402b can be opened to allow a gas from a gas source to flow into the bottom ion chamber 302b. The gas pressure from the gas source can be regulated by the purging and refilling system 500 to allow the top and/or bottom ion chambers 302a, 302b slightly over-pressurized with the new gas, e.g., at a pressure of 5 psig. Preferably, in a purge-in cycle, both the first valve 402a and the second valve 402b are opened to allow a gas from a gas source to flow into the top ion chamber 302a and the bottom ion chamber 302b simultaneously and slightly over-pressurize the top ion chamber 302a and the bottom ion chamber 302b simultaneously. This would help avoid or reduce the risks of damaging the internal structures of the ion chamber such as the electrodes 304, insulative films or plates supporting the electrodes etc. In a purge-out cycle shown in FIG. 4B, the gas pressure can be adjusted or reduced by the purging and refilling system 500 e.g., to 1 psig, to allow the gas within the top ion chamber 302a and/or the bottom ion chamber 302b to be vented out. The purge-in and purge-out cycle can be repeated multiple times, as illustrated in FIGS. 2A-2B, until the concentration of contaminants in the chambers 302a, 302 is below to an acceptable level. The contaminant concentration can be measured from the gas vented out of the chambers 302a, 302b. Once the concentration of contaminants is reduced to an acceptable level, a final refilling of the ion chambers 302a, 302b can occur. As shown in FIG. 4C, upon completion of the final refilling, the first valve 402a and/or the second valve 402b can be closed to seal the ion chambers 302a, 302b. The purging and refilling system 500 can be disconnected from the valve assembly 400, completing the refurbishing process. The operational pressure within the ion chambers 302a, 302b may range from 2 to 6 psig.

With reference to FIGS. 4A-4C, according to embodiments of the disclosure, the purge-in and purge-out cycles can be conducted while the source of radiation 102 (see also FIG. 1) is turned on and a radiation beam 104 irradiates the ion chambers 302a, 302b. A high dose rate of radiation can help break down and vaporize larger molecules or contaminants formed or deposited in the ion chambers. Alternatively, the purge-in and purge-out cycles can be conducted while the source of radiation 102 is turned off. In some embodiments, the purge-in and purge-out cycles can be conducted at an elevated temperature to help break down and vaporize larger molecules or contaminants in the ion chambers.

Figure 5:
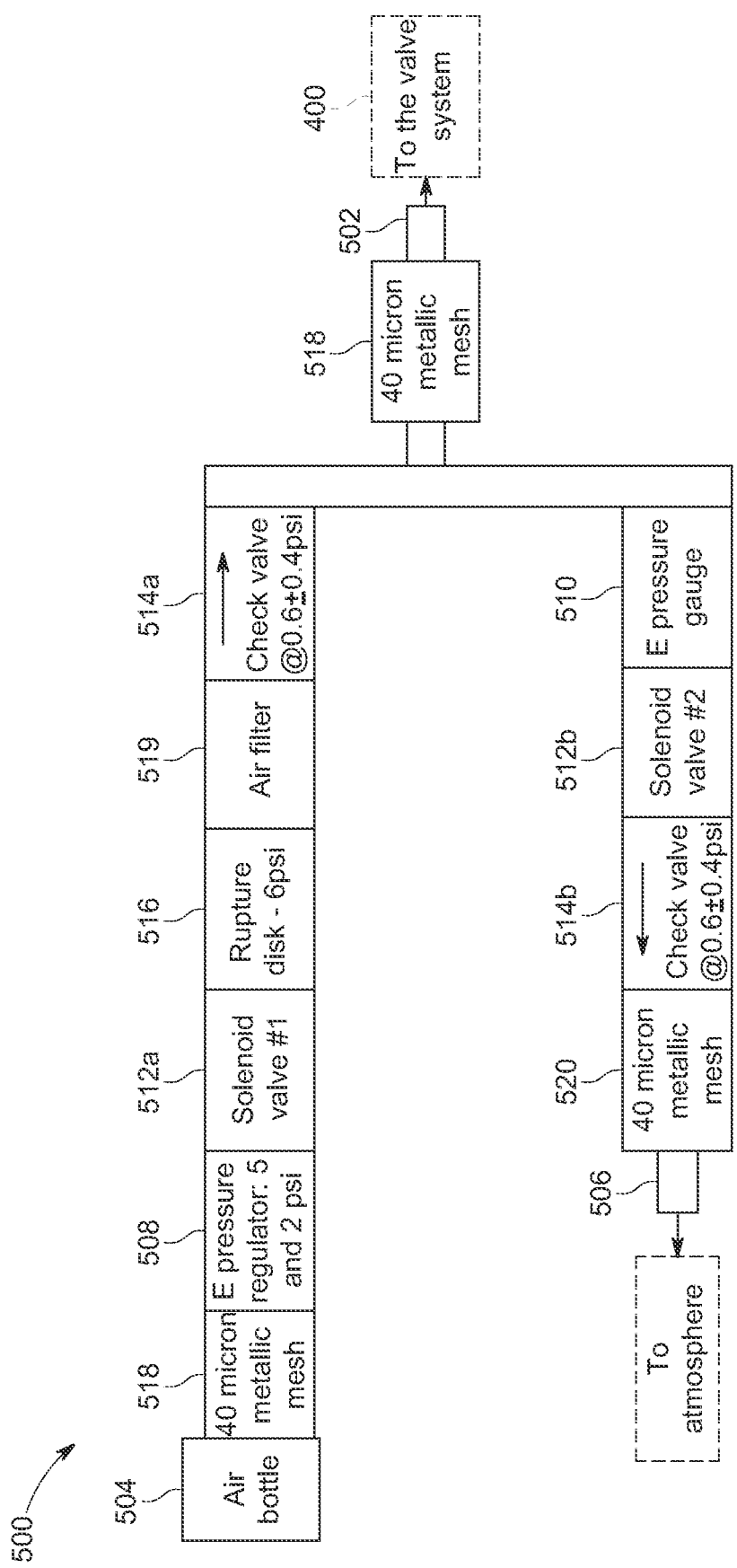
FIG. 5 is a diagram showing an example purging and refilling system according to embodiments of the disclosure.

With reference now to FIG. 5, a purging and refilling system 500 according to embodiments of the disclosure is shown. The purging and refilling system 500 can be used to conduct refurbishment of the ion chamber 300 shown in FIGS. 3A-3B and FIGS. 4A-4C. As shown in FIG. 5, the purging and refilling system 500 may include a port 502 for connecting with a valve assembly 400 integrated with an ion chamber to be refurbished. The purging and refilling system 500 includes a gas source 504 providing a new or pristine gas for purging and refilling an ion chamber and a vent 506 for exhausting gas purged out of the ion chamber. The gas source may supply air, a gas containing oxygen, or any other suitable gases. The gas source may include a gas bottle or container, or a supply of gas harnessed from the room air passing through a filtering system including e.g., a desiccant and a filter, etc. The purging and refilling system 500 may include a pressure regulator 508 for controlling the pressure of the gas flowing into an ion chamber, and a pressure gauge 510 for measuring the venting pressure. Preferably, the pressure regulator 508 and pressure gauge 510 are electronic to allow for automation of the refurbishing process and reduce the risks associated with human errors. By way of example, the electronic pressure regulator 508 may be automatically controlled by a computer (not shown in FIG. 5) to provide a pressure profile shown in FIG. 2B, e.g., setting a pressure at 4-6 psig for a purge-in cycle and a pressure at 2-6 psig for a final refilling. The electronic pressure gauge 510 may form a closed loop with a solenoid valve to increase reliability.

With reference to FIG. 5, the purging and refilling system 500 may include a first valve e.g., a first solenoid valve 512a and a second valve, e.g., a second solenoid valve 512b for controlling the gas flow or purge-in and purge-out cycles. The use of solenoid valves 512a, 512b allows for automation of the refurbishing process via a computer control. By way of example, in a purge-in cycle, the first solenoid valve 512a can be opened and the second solenoid 512b closed, to allow a gas from the gas source 504 to flow into an ion chamber. In a purge-out cycle, the first solenoid valve 502a can be closed and the second solenoid 502b opened, to allow the pressurized gas in the ion chamber to vent out. A first check valve 514a may be provided to ensure a one-way gas flow in the direction from the gas source 504 to an ion chamber in the purge-in cycle. A second check valve 514b may be provided to ensure a one-way gas flow in the direction from the ion chamber to the vent 506 in the purge-out cycle.

With reference to FIG. 5, the purging and refilling system 500 may include safety features to minimize the risks of damaging an ion chamber during the refurbishing process. For example, a mechanical fuse or rupture disk 516 may be built in the purging and refilling system 500 to protect the ion chamber in case of an unexpected gas pressure surge. The purging and refilling system 500 may also include various filters to ensure the quality of the filling gas and/or prevent pollution. For example, one or more metallic meshes 518 and air filter 519 may be built in the purging and refilling system 500 to clean the filling gas by removing microparticles or impurities that may be present. One or more metallic meshes 520 may be built in the purging and refilling system 500 to filter the purged gas before exhausting to the atmosphere.

In one aspect of the disclosure, a method of refurbishing an ion chamber is provided. In general, the method comprises removing the existing gas in an ion chamber, and refilling the ion chamber with a pristine gas. The method can be conducted while the ion chamber is installed in a radiation machine, without the need to take the ion chamber out of the radiation machine. The method can be conducted while the ion chamber is under radiation produced by the radiation machine or not under radiation.

Figure 6:
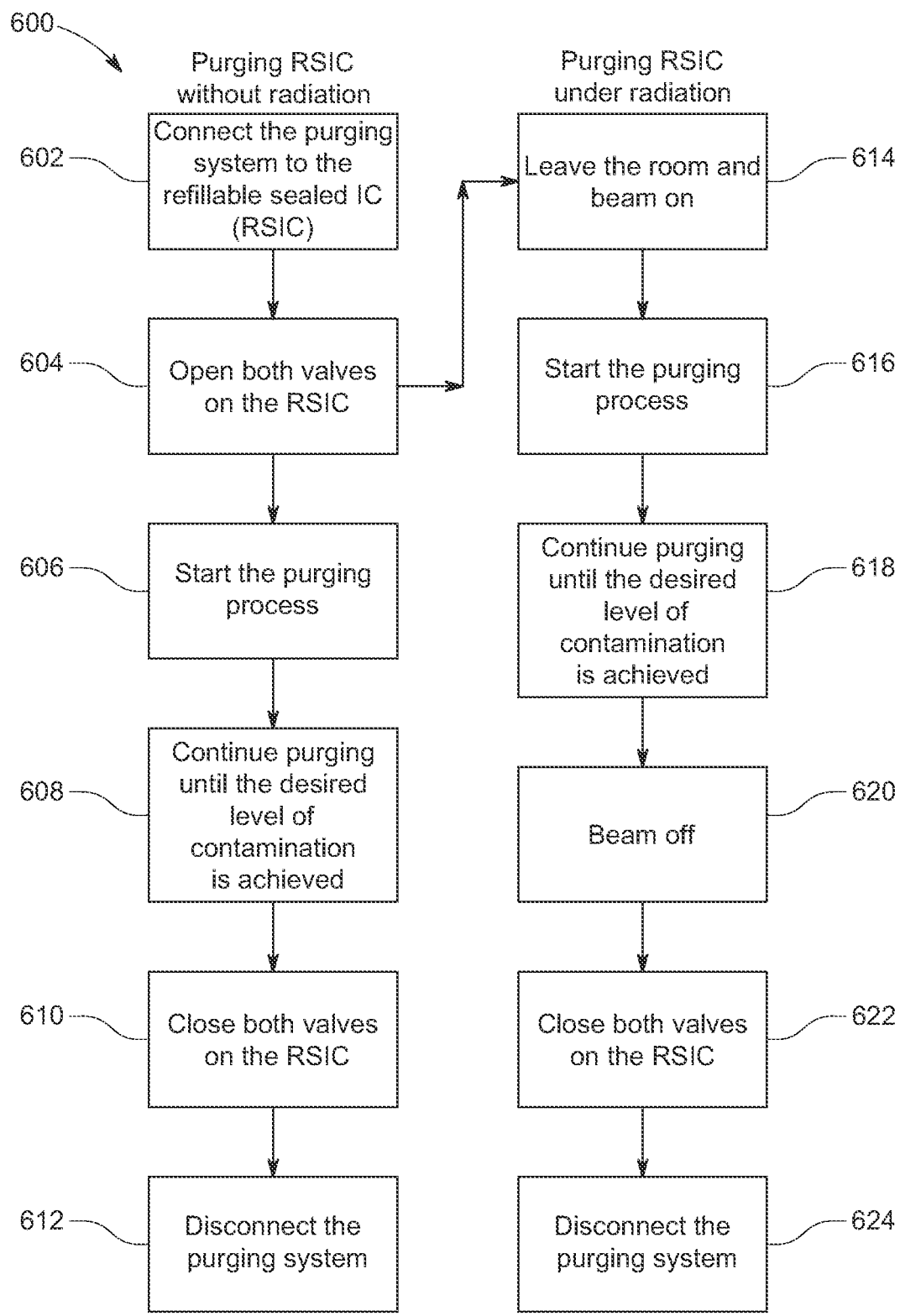
FIG. 6 is a flowchart illustrating example steps of a method according to embodiments of the disclosure.

With reference to FIG. 6, example steps of a method 600 of refurbishing an ion chamber can be implemented as shown. By way of example, the purging and filling system may be an automated purging and filling system 500 shown in FIG. 5. The ion chamber may be a refillable sealed ion chamber (RSIC) 300 integrated with a valve assembly 400 shown in FIGS. 3A-3B and FIGS. 4A-4B. As shown in FIG. 6, the method may start at 602 by connecting a purging and filling system with an ion chamber. The ion chamber may be installed in a radiation machine and remains in the radiation machine during the refurbishing process.

At step 604, the valve or valves coupled to the ion chamber can be opened, manually or electronically by a computer control. In an embodiment where the method is conducted while the ion chamber is not under radiation, the purging can start at step 606 and continue until an acceptable level of contamination is achieved at step 608. At step 610, the valve or valves coupled to the ion chamber can be closed. At step 612, the purging and refilling system can be disconnected from the valve assembly to complete the refurbishing process.

In an embodiment where the method is conducted while the ion chamber is under radiation, the operator may leave the room to allow the radiation source to be turned on at step 614. Then, at step 616 the purging can start and continue until an acceptable level of contamination is achieved at step 618. The radiation source can be then turned off at step 620, and the valve or valves integrated with the ion chamber closed at step 622. At step 624, the purging and refilling system can be disconnected from the valve assembly to complete the refurbishing process.

Various embodiments of an apparatus including an ion chamber integrated with a valve assembly and a method of refurbishing an ion chamber are described. Advantageously, the apparatus and method effectively address the issues of oxygen depletion and gas contamination failure mechanisms and allow for continuous or scheduled refurbishment of the ion chamber. The ion chamber does not need to be removed out of a radiation machine for refurbishment, eliminating or reducing the need for retuning and recommissioning of the radiation machine as required for conventional replacement of a new ion chamber. As such, the costs associated with replacement of new ion chambers can be avoided or significantly minimized.

Various embodiments have been described with reference to the figures. It should be noted that the figures are intended to facilitate illustration and some figures are not necessarily drawn to scale. Further, in the figures and description, specific details may be set forth in order to provide a thorough understanding of the disclosure. It will be apparent to one of ordinary skill in the art that some of these specific details may not be employed to practice embodiments of the disclosure. In other instances, well known components or process steps may not be shown or described in detail in order to avoid unnecessarily obscuring embodiments of the disclosure.

All technical and scientific terms used herein have the meaning as commonly understood by one of ordinary skill in the art unless specifically defined otherwise. As used in the description and appended claims, the singular forms of "a," "an," and "the" include plural references unless the context clearly dictates otherwise. The term "or" refers to a nonexclusive "or" unless the context clearly dictates otherwise. Further, the term "first" or "second" etc. may be used to distinguish one element from another in describing various similar elements. It should be noted the terms "first" and "second" as used herein include references to two or more than two. Further, the use of the term "first" or "second" should not be construed as in any particular order unless the context clearly dictates otherwise. Various relative terms such as "top," "bottom," "upper," "lower," or similar terms may be used herein for ease of describing relative positions, directions, or spatial relationships in conjunction with the drawings. The use of the relative terms should not be construed as to imply a necessary positioning, orientation, or direction of the structures or portions thereof in manufacturing or use, and to limit the scope of the invention. The term "coupled," "supported," "connected," "mounted", and variations are used broadly and encompass both direct and indirect couplings, supports, connections, and mounting.

Those skilled in the art will appreciate that various other modifications may be made. All these or other variations and modifications are contemplated by the inventors and within the scope of the invention.

What is claimed is:

1. An apparatus, comprising:
   an ion chamber including a housing enclosing a gas and one or more electrodes;
   a valve assembly coupled to the ion chamber to control a replacement of the gas within the housing; and
   a structure supporting the valve assembly, wherein the structure isolates a weight of the valve assembly from a weight of the ion chamber.

2. The apparatus of claim 1, wherein the housing is hermetically sealed to maintain a desired operational pressure in the housing.

3. The apparatus of claim 1, wherein the structure supporting the valve assembly reduces a load transfer from the valve assembly to the ion chamber.

4. The apparatus of claim 1, wherein the valve assembly includes a valve constructed from a radiation resistant material.

5. The apparatus of claim 1, wherein
   the housing includes a first hermetically sealed chamber and a second hermetically sealed chamber, the first hermetically sealed chamber enclosing a first portion of the gas and at least one of the one or more electrodes, the second hermetically sealed chamber enclosing a second portion of the gas and at least one of the one or more electrodes, and
   the valve assembly includes at least one first valve coupled to the first hermetically sealed chamber to control a replacement of the first portion of the gas and at least one second valve coupled to the second hermetically sealed chamber to control a replacement of the second portion of the gas, and
   the valve assembly is configured to control the replacement of the first portion of the gas and the replacement of the second portion of the gas simultaneously.

6. The apparatus of claim 1, wherein the ion chamber is configured to detect one or more characteristics of radiation produced by a source of radiation.

7. The apparatus of claim 6, wherein the one or more characteristics of radiation are at least one of intensity, homogeneity, or symmetry of a beam of radiation produced by the source.

8. The apparatus of claim 6, further comprising:
   a gantry enclosing or supporting the source, the ion chamber, and the valve assembly.

9. The apparatus of claim 8, further comprising:
   a purging and refilling system configured to couple with the valve assembly, wherein the purging and refilling system includes a gas source to replace the gas enclosed in the housing of the ion chamber.

10. The apparatus of claim 9, wherein the purging and refilling system includes an electronic pressure regulator to provide a pressure profile for the gas from the gas source.

11. The apparatus of claim 10, wherein the purging and refilling system further includes
    a first valve to control a flow of the gas from the gas source to the housing, and
    a second valve to control a flow of the gas from the housing to a vent.

12. The apparatus of claim 11, wherein an operation of the electronic pressure regulator, the first valve, and the second valve is automatically controlled.

13. The apparatus of claim 1, further comprising:
a purging and refilling system configured to couple with the valve assembly, wherein the purging and refilling system includes a gas source to replace the gas in the housing.

14. The apparatus of claim 13, wherein the purging and refilling system includes an electronic pressure regulator configured to provide a pressure profile for the gas from the gas source.

15. The apparatus of claim 14, wherein the purging and refilling system further includes a first valve to control a flow of a gas from the gas source to the housing, and a second valve to control a flow of the gas from the housing to a vent, wherein an operation of the electronic pressure regulator, the first valve, and the second valve is automatically controlled.

16. A method of refurbishing an ion chamber including a housing enclosing a contaminated gas and one or more electrodes, the method comprising:
removing the contaminated gas enclosed in the housing by allowing the contaminated gas to flow out of the housing through a valve assembly coupled to the housing, the valve assembly being supported by a structure isolating a weight of the valve assembly from a weight of the ion chamber, and
refilling the housing with a gas from a gas source by allowing the gas to flow into the housing through the valve assembly.

17. The method of claim 16, wherein the ion chamber is installed in a radiation machine comprising a source of radiation.

18. The method of claim 17, wherein the source of radiation is turned on producing a beam of radiation to irradiate the ion chamber.

19. The method of claim 16, wherein the method is performed until a level of contamination is reached.

20. The method of claim 16, wherein
the housing includes a first hermetically sealed chamber and a second hermetically sealed chamber, the first hermetically sealed chamber enclosing a first portion of the contaminated gas and at least one of the one or more electrodes, the second hermetically sealed chamber enclosing a second portion of the contaminated gas and at least one of the one or more electrodes,
the removing removes the first portion of the contaminated gas by allowing the first portion of contaminated gas to flow through a first valve of the valve assembly coupled to the first hermetically sealed chamber and removes the second portion of the contaminated gas by allowing the second portion of contaminated gas to flow through a second valve of the valve assembly coupled to the second hermetically sealed chamber simultaneously, and
the refilling refills the first hermetically sealed chamber with the gas from the gas source by allowing the gas to flow into the first hermetically sealed chamber through the first valve and refills the second hermetically sealed chamber with the gas from the gas source by allowing the gas from the gas source to flow into the second hermetically sealed chamber through the second valve simultaneously.

* * * * *